(12) United States Patent  (10) Patent No.:     US 9,897,734 B2
Cui et al.                      (45) Date of Patent:      Feb. 20, 2018

(54) POLARIZING FILM AND DISPLAY DEVICE HAVING THE POLARIZING FILM

(71) Applicant: Wuhan China Star Optoelectronics Technology Co., Ltd., Wuhan, Hubei (CN)

(72) Inventors: Hongqing Cui, Guangdong (CN); Guowei Zha, Guangdong (CN); Kaineng Yang, Guangdong (CN)

(73) Assignee: WUHAN CHINA STAR OPTOELECTRONICS TECHNOLOGY CO., LTD, Wuhan, Hubei (CN)

( * ) Notice: Subject to any disclaimer, the term of this patent is extended or adjusted under 35 U.S.C. 154(b) by 0 days.

(21) Appl. No.: 15/212,551

(22) Filed: Jul. 18, 2016

(65) Prior Publication Data
US 2017/0351017 A1    Dec. 7, 2017

(30) Foreign Application Priority Data

Jun. 1, 2016   (CN) .......................... 2016 1 0382562

(51) Int. Cl.
*G02B 5/30*     (2006.01)
*G02F 1/13363*  (2006.01)
(Continued)

(52) U.S. Cl.
CPC ......... *G02B 5/3058* (2013.01); *G02B 5/3083* (2013.01); *G02F 1/13363* (2013.01);
(Continued)

(58) Field of Classification Search
CPC ................ G02B 5/3058; G02B 5/3083; G02F 1/133528; G02F 1/13363;
(Continued)

(56) References Cited

U.S. PATENT DOCUMENTS 6,590,695 B1 * 7/2003 Kurtz ................... G02B 5/3058
                                                     359/245
7,002,742 B2 * 2/2006 Imaizumi ................. G02B 1/11
                                                    359/484.03
(Continued)

FOREIGN PATENT DOCUMENTS

| CN | 202230278 A | 5/2012 |
| CN | 102540314 A | 7/2012 |
| JP | 2013109110 A | 3/2013 |

*Primary Examiner* — Frank Font
(74) *Attorney, Agent, or Firm* — Andrew C. Cheng

(57) ABSTRACT

The present application discloses a polarizing film and a display device including the polarizing film. The polarizer includes a transparent substrate; a linear polarizer disposed on the transparent substrate; an optical retardation film disposed on the transparent substrate; the linear polarizer including a first dielectric layer covered on the transparent substrate and a metal layer disposed on the first dielectric layer; and the optical retardation film including a second dielectric layer disposed on the transparent substrate to solve the mechanical, optical and lifetime issues faced to the conventional organic polarizing film, while solving the problem of the increased thickness of optical films owing to the manufacture and adhesion of polarizer and retardation film separately.

6 Claims, 3 Drawing Sheets

(51) Int. Cl.
*H01L 51/52* (2006.01)
*G02F 1/1335* (2006.01)

(52) U.S. Cl.
CPC .... *G02F 1/133528* (2013.01); *H01L 51/5275* (2013.01); *H01L 51/5281* (2013.01); *G02F 2001/133548* (2013.01); *G02F 2001/133638* (2013.01); *G02F 2413/01* (2013.01); *G02F 2413/05* (2013.01)

(58) Field of Classification Search
CPC ........ G02F 2001/133548; G02F 2001/133638; G02F 2413/01; G02F 2413/05; H01L 51/5275; H01L 51/5281
USPC .................. 359/485.05, 487.03; 349/96, 117
See application file for complete search history.

(56) References Cited

U.S. PATENT DOCUMENTS

| | | | |
|---|---|---|---|
| 8,013,953 B2 | 9/2011 | Matsumori et al. | |
| 9,588,374 B2 | 3/2017 | Anderson et al. | |
| 9,684,177 B2 | 6/2017 | Kim et al. | |
| 2004/0095637 A1* | 5/2004 | Nikolov | G02B 5/1809 359/352 |
| 2015/0236300 A1* | 8/2015 | Naraoka | H01L 51/5262 257/40 |
| 2016/0054496 A1* | 2/2016 | Ichihashi | G01N 21/88 250/338.1 |
| 2016/0011351 A1 | 6/2016 | Tomohisa et al. | |
| 2016/0025912 A1 | 6/2016 | Zeng et al. | |
| 2016/0356934 A1 | 12/2016 | Li | |
| 2017/0038640 A1 | 2/2017 | Wang | |

\* cited by examiner

POLARIZING FILM AND DISPLAY DEVICE HAVING THE POLARIZING FILM

FIELD OF THE INVENTION

The present application relates to a display technology field, and more particularly to a polarizing film and a display device having the polarizing film.

BACKGROUND OF THE INVENTION

A polarizer is an important optical shutter in the display device. Controlling the polarization state of light can efficiently limit the specific polarizing light to pass or not. Conventional polarizers are formed by organic materials and have the advantage of a mature manufacturing process, preparation in a large-scale area and good uniformity. But, the organic material has the problem of instable mechanical and optical properties, and will gradually deviate from the ideal optical and mechanical state as the external environment (such as temperature, humidity, air composition) changes or as time goes by. There are issues of the emergence of deterioration of uniformity, mechanical deformation, optical transmittance change or color differences. On the other hand, the polarization rate and the transmittance rate is a contradiction, a good optical transmittance rate needs to reduce the thickness of the film, with the sacrifice of reducing the polarization rate. The current thickness for polarizers in common is about 100 μm and it has become an important hurdle for a much thinner display. Besides, the optical retardation films (including quarter-wave plate and half-wave plate) are also commonly used in the display device, usually used in conjunction with the polarizer, and the two films together will increase the thickness of the module.

SUMMARY OF THE INVENTION

The present application discloses a polarizing film and a display device including the polarizing film to solve the mechanical, optical and lifetime issues faced by the organic polarizing film, and to solve the problem of increasing the thickness of the transparent substrate by the manufacturing and the adhesive of the polarizer and the retardation film separately.

In order to solve the technical problem described above, a technology approach adapted by the application is providing a polarizing film that includes: a transparent substrate; a linear polarizer disposed on the transparent substrate; an optical retardation film disposed on the transparent substrate; the linear polarizer includes a first dielectric layer covered on the transparent substrate and a metal layer disposed on the first dielectric layer; and the optical retardation film includes a second dielectric layer disposed on the transparent substrate.

The linear polarizer and the optical retardation film are disposed on the same or different side of the transparent substrate.

The metal layer of the linear polarizer is a periodically arranged striping metal wire, the period of the metal wire 122 is 20-500 nm, the duty ratio is 0.1 to 0.9 and the height of the metal wire 122 is 10-500 nm.

The material of the metal wire of the linear polarizer is selected from one or more than one composite from Al, Ag, and Au, the material of the dielectric layer is selected from one or more than one composite from $SiO_2$, SiO, MgO, $Si_3N_4$, $TiO_2$ and of $Ta_2O_5$.

The second dielectric layer of the optical retardation film is a periodically arranged striping dielectric line, the period of the dielectric line is less than half wavelength of the incident light.

The period of the dielectric line of the optical retardation film is 100-700 nm, the duty ratio is 0.1 to 0.9 and the height of the dielectric line is 0.1-10 μm.

The material of the dielectric line of the optical retardation film is selected from one or more than one composite from PMMA, $SiO_2$, SiO, MgO, $Si_3N_4$, $TiO_2$ and of $Ta_2O_5$.

The optical retardation film is set as a quarter-wave plate or a half-wave plate.

The striping direction of the metal wire and the dielectric line is parallel, perpendicular or obliquely arrangement.

In order to solve the technical problem described above, another technology approach adapted by the application is providing a display device including a polarizer according to the polarizing film described above.

Compared to the conventional technology, the advantage of the application is the polarizing film. By disposing the polarizer and the optical retardation film on the same transparent substrate, it can solve the mechanical, optical and lifetime issues faced by the conventional organic polarizing film, while solving the problem of the increased thickness of optical films owing to the manufacture and adhesion of polarizer and retardation film separately.

BRIEF DESCRIPTION OF THE DRAWINGS

In order to more clearly illustrate the embodiments of the present application or prior art, the following figures will be described in the embodiments which are briefly introduced. It is obvious that the drawings are merely examples of some embodiments of the present application, and thus those of ordinary skill in this field can understand that these figures are not used to limit the present application.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
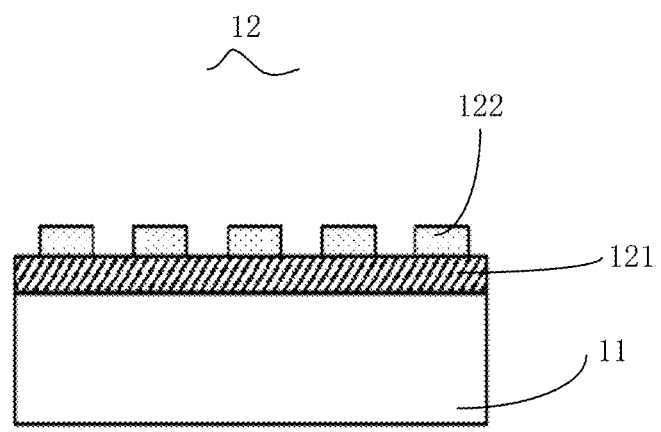
FIG. 1 is a schematic view of the structure of the polarizer of the present application.
Figure 2:
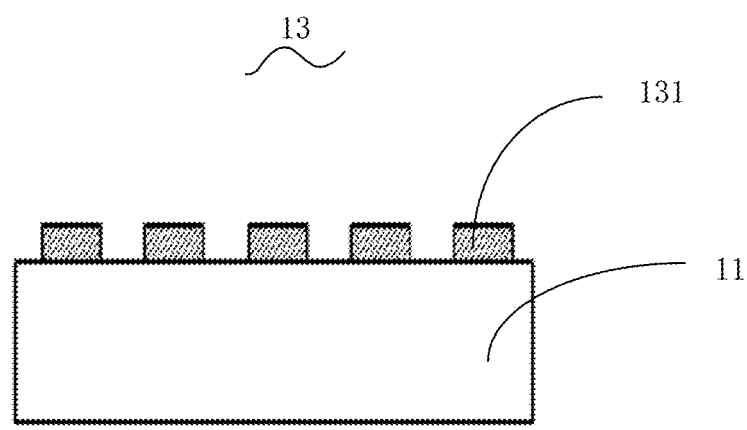
FIG. 2 is a schematic view of the structure of the retardation film of the present application.
Figure 3:
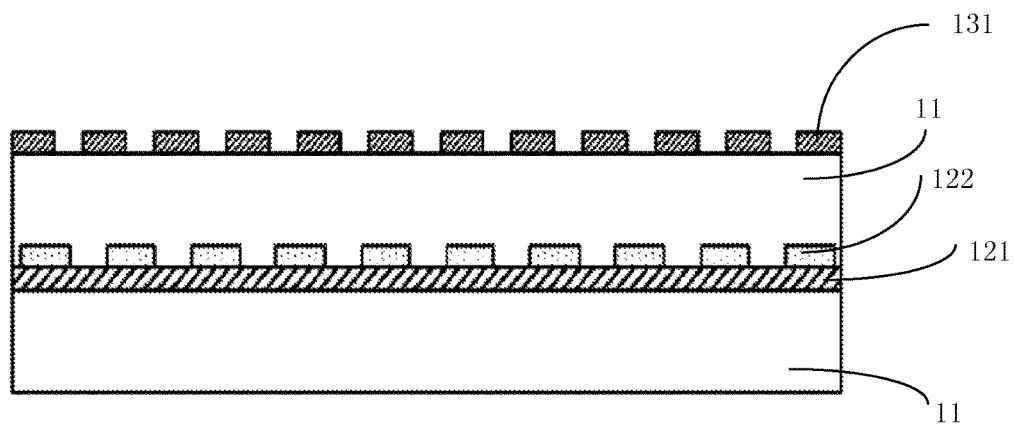
FIG. 3 is a schematic view of the structure of the polarizing film according to the first embodiment of the present application.

Referring to FIGS. 1 to 3, FIG. 3 is a schematic view of the structure of the polarizing film according to the first embodiment of the present application. The polarizing film includes a transparent substrate 11, a linear polarizer 12 disposed on the transparent substrate 11, and an optical retardation film 13 disposed on the transparent substrate 11. As illustrated in FIG. 1, the linear polarizer 12 includes a first dielectric layer 121 covered on the transparent substrate 11 and a metal layer disposed on the first dielectric layer 121 and the metal layer is a periodically arranged striping metal wire 122. As illustrated in FIG. 2, the optical retardation film 13 includes a second dielectric layer disposed on the transparent substrate 11, and the second dielectric layer is a periodically arranged striping dielectric line 131.

In the present embodiment, the linear polarizer 12 and the optical retardation film 13 are disposed on the same side of the transparent substrate 11. The transparent substrate 11 includes an upper surface and a lower surface, the linear polarizer 12 and the optical retardation film 13 are disposed on the upper surface of the transparent substrate 11, or the linear polarizer 12 and the optical retardation film 13 are disposed on the lower surface of the transparent substrate 11.

Figure 4:
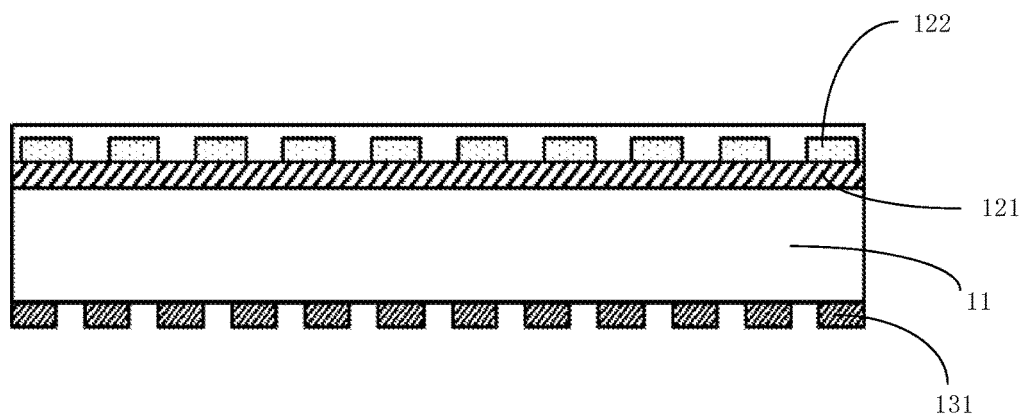
FIG. 4 is a schematic view of the structure of the polarizing film according to the second embodiment of the present application.

As illustrated in FIG. 4, the difference between the polarizing film in the first embodiment and the polarizing film in the second embodiment is: the linear polarizer 12 and the optical retardation film 13 are disposed on different side of the transparent substrate 11. The transparent substrate 11 includes an upper surface and a lower surface, the linear polarizer 12 and the optical retardation film 13 are disposed on the upper surface and the bottom surface of the transparent substrate 11 separately. Such as the linear polarizer 12 is disposed on the upper surface of the transparent substrate 11 and the optical retardation film 13 is disposed on the bottom surface of the transparent substrate 11. Or the linear polarizer 12 is disposed on the bottom surface of the transparent substrate 11 and the optical retardation film 13 is disposed on the upper surface of the transparent substrate 11.

In the linear polarizer 12, the metal wire 122 is periodically disposed on the first dielectric layer 121. The polarizing light TM perpendicular to the polarizing direction of the striping metal wire 122 can be significantly pass through, and reflect the polarizing light TE parallel to the polarizing direction of the striping metal wire 122. The period of the metal wire 122 is 20-500 nm, wherein the period is the width of the metal wire 122 plus the distance between the metal wire 122. The duty ratio is 0.1 to 0.9 and the height of the metal wire 122 is 10-500 nm.

In the linear polarizer 12, the material of the metal wire 122 is with larger imaginary part of the refractive index. The material of the metal wire 122 is selected from one or more than one composite from Al, Ag, and Au. The material of the first dielectric layer 121 is selected from one or more than one composite from $SiO_2$ (silicon dioxide), SiO (silicon oxide), MgO (magnesium oxide), $Si_3N_4$ (silicon nitride), $TiO_2$ (titanium dioxide) and of $Ta_2O_5$ (tantalum pentoxide).

In the optical retardation film 13, the dielectric line 131 is periodically disposed on the transparent substrate 11. When the period of the dielectric line 131 is less than half wavelength of the incident light, the refraction index of the Bloch wave supported by the dielectric line 131 is different from the TM and TE, namely birefringence, and the difference of the refractive index is usually about 0.01 to 0.2.

In the optical retardation film 13, the period of the dielectric line 131 is 100-700 nm, wherein the period is the width of the dielectric line 131 plus the distance between the dielectric line 131. The duty ratio is 0.1 to 0.9 and the height of the dielectric line 131 is 0.1-10 μm.

In the optical retardation film 13, the material of the dielectric line 131 is selected from one or more than one composite from polymethyl methacrylate, PMMA, $SiO_2$, SiO, MgO, $Si_3N_4$, $TiO_2$ and of $Ta_2O_5$.

According to the difference of the refractive index and the width of the optical retardation film 13 can be set as a quarter-wave plate or a half-wave plate.

The striping direction of the metal wire 122 is parallel to the arranged striping direction of the dielectric line 131, and the striping direction of the metal wire 122 and the striping direction of the dielectric line 131 should be arranged according to the required placement angle of the polarizer 12 and the optical retardation film 13.

The manufacturing process and accuracy of the metal wire 122 is compatible with that of the dielectric line 131, which can be prepared using the same processes, such as nano-imprint and the like.

The material of the transparent substrate 11 is selected from one or more than one composite from Polyethylene terephthalate, PET, and Polyethylene-Chlorinated, PEC.

Figure 5:
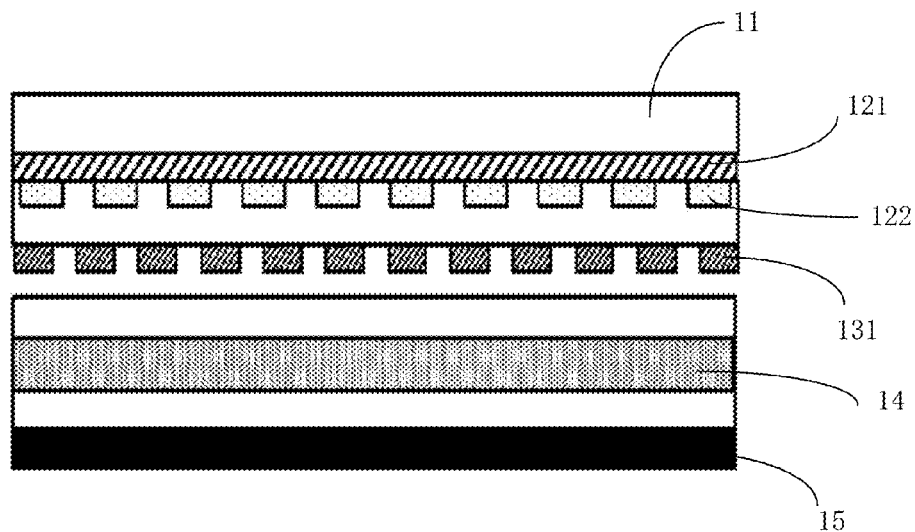
FIG. 5 is a schematic view of the structure of the display device according to the first embodiment of the present application.

FIG. 5 is a schematic view of the display device according to the first embodiment of the present application. The display device is an OLED display device which includes a polarizing film, an OLED light emitting layer 14, and a refraction layer 15. The polarizing film can be the polarizing film described in the above embodiment.

Figure 6:
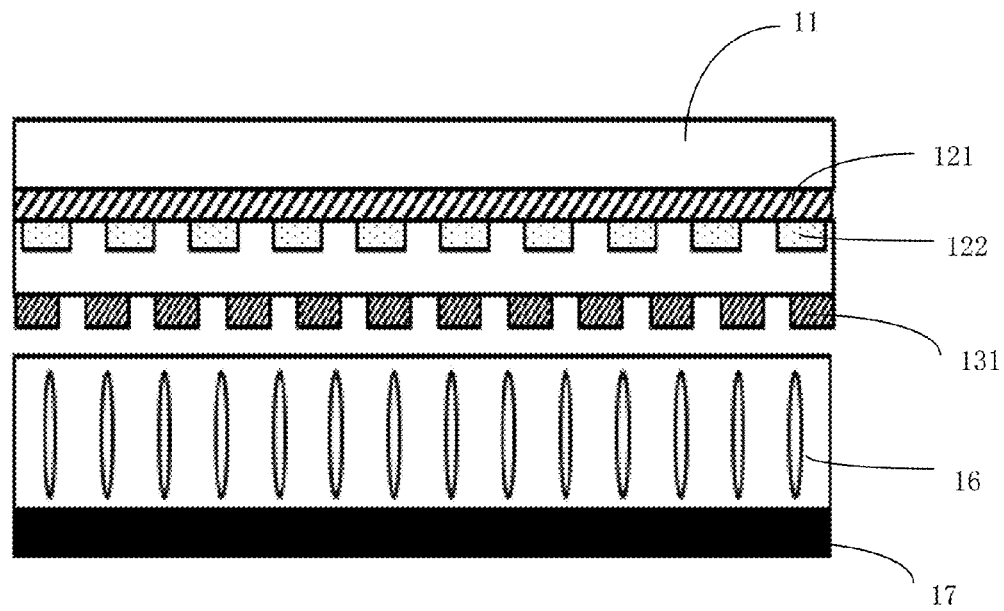
FIG. 6 is a schematic view of the structure of the display device according to the second embodiment of the present application.

FIG. 6 is a schematic view of the display device according to the second embodiment of the present application. The display device is a reflective display device which includes a polarizing film, a liquid crystal layer 16, and a refraction layer 17. The polarizing film can be the polarizing film described in the above embodiment.

The polarizing film is formed by disposing the polarizer and the optical retardation film on the same transparent substrate, and thus it can solve the mechanical, optical and lifetime issues faced by the conventional organic polarizing film, while solving the problem of the increased thickness of optical films owing to the manufacture and adhesion of polarizer and retardation film separately.

Above are embodiments of the present application, which does not limit the scope of the present application. Any modifications, equivalent replacements or improvements within the spirit and principles of the embodiment described above should be covered by the protected scope of the invention.

What is claimed is:

1. A polarizing film, comprising:
a transparent substrate;
a linear polarizer disposed on the transparent substrate; and
an optical retardation film disposed on the transparent substrate;
wherein the linear polarizer includes a first dielectric layer disposed on the transparent substrate and a metal layer disposed on the first dielectric layer; and the optical retardation film c includes a second dielectric layer disposed on the transparent substrate;

the metal layer of the linear polarizer includes striping metal wires periodically arranged with a period of 20-500 nm, a duty ratio is 0.1 to 0.9 and a height of the metal wire is 10-500 nm;

the second dielectric layer of the optical retardation film includes striping dielectric lines periodically arranged with a period of 100-700 nm, a duty ratio is 0.1 to 0.9 and a height of the the dielectric line is 0.1-10 μm; and the period of the dielectric lines is less than half wavelength of the incident light.

2. The polarizing film according to claim 1, wherein the linear polarizer and the optical retardation film are disposed on the same or different side of the transparent substrate.

3. The polarizing film according to claim 1, wherein the material of the metal wire of the linear polarizer is selected from one or more than one composite from Al, Ag, and Au, the material of the dielectric layer is selected from one or more than one composite from $SiO_2$, SiO, MgO, $Si_3N_4$, $TiO_2$ and of $Ta_2O_5$.

4. The polarizing film according to claim 1, wherein the material of the dielectric line of the optical retardation film is selected from one or more than one composite from PMMA, $SiO_2$, SiO, MgO, $Si_3N_4$, $TiO_2$ and of $Ta_2O_5$.

5. The polarizing film according to claim 1, wherein the optical retardation film is set as a quarter-wave plate or a half-wave plate.

6. A display device, wherein the display device comprising the polarizing film according to claim 1.

* * * * *